US007651833B2

(12) United States Patent
Kang et al.

(10) Patent No.: US 7,651,833 B2
(45) Date of Patent: Jan. 26, 2010

(54) METHOD FOR PREPARING PHOTOCHROMIC FILM OR PLATE

(75) Inventors: Tae-Sik Kang, Daejeon (KR); Sang-Hyuk Im, Daejen (KR); Seung-Heon Lee, Daejeon (KR); Young-Jun Hong, Daejeon (KR)

(73) Assignee: LG Chem, Ltd., Seoul (KR)

( * ) Notice: Subject to any disclaimer, the term of this patent is extended or adjusted under 35 U.S.C. 154(b) by 408 days.

(21) Appl. No.: 11/515,934

(22) Filed: Sep. 6, 2006

(65) Prior Publication Data

US 2007/0003776 A1 Jan. 4, 2007

(30) Foreign Application Priority Data

Sep. 6, 2005 (KR) ...................... 10-2005-0082746

(51) Int. Cl.
*G03F 7/00* (2006.01)
*G03F 7/004* (2006.01)

(52) U.S. Cl. .................... 430/321; 430/322; 430/270.1; 430/270.15; 430/273.1; 430/330; 430/935

(58) Field of Classification Search ................. 430/321, 430/322, 270.1, 270.15, 330, 935, 273.1
See application file for complete search history.

(56) References Cited

U.S. PATENT DOCUMENTS

2006/0234133 A1* 10/2006 Nagate .......................... 430/1
2006/0257747 A1* 11/2006 Nagate .......................... 430/1
2007/0047420 A1* 3/2007 Yanagihara ................. 369/103
2007/0047421 A1* 3/2007 Usami ......................... 369/103
2007/0054195 A1* 3/2007 Usami ........................... 430/2
2007/0059478 A1* 3/2007 Nagate et al. .............. 428/64.1
2007/0177271 A1* 8/2007 Matsunaga .................. 359/582

FOREIGN PATENT DOCUMENTS

JP 06102603 A * 4/1994

OTHER PUBLICATIONS

Machine translation of JP 06-102603A.*

* cited by examiner

*Primary Examiner*—Amanda C. Walke
(74) *Attorney, Agent, or Firm*—McKenna Long & Aldridge LLP

(57) ABSTRACT

The present invention relates to a method of preparing a photochromic film or plate comprising printing a photochromic substance in the unit of an independent spot on a part or the whole of a basic material and forming a protective layer on the basic material, on which the photochromic substance is coated, so as to protect the photochromic substance. According to the present invention, the photochromic substance is printed in the unit of an independent spot so that the printed unit spots are isolated from each other, thereby prolonging the life of the photochromic substance.

12 Claims, 3 Drawing Sheets

METHOD FOR PREPARING PHOTOCHROMIC FILM OR PLATE

This application claims the benefit of the filing date of Korean Patent Application No. 10-2005-0082746 filed on Sep. 6, 2005 in the Korean Intellectual Property Office, the disclosure of which is incorporated herein in its entirety by reference.

TECHNICAL FIELD

The present invention relates to a method for preparing a photochromic film or plate, and more particularly, to a method for preparing a photochromic film or plate, in which a photochromic substance is printed in the unit of an independent spot on a part or the whole of a basic material by various printing methods and then a protective layer is formed on the basic material on which the photochromic substance is printed so that the photochromic substances are isolated from each other, thereby prolonging the life of the photochromic substance.

BACKGROUND ART

Photochromic substances have been widely used in basic materials such as glass, plastic and the like to fabricate spectacle lenses, optical lenses, sunglasses, sun caps, ski goggles, toys, mirrors, glasses, films, building exterior materials, advertising materials, optical discs, etc.

Organic photochromic substances including a polymer matrix containing photochromic dyes are known through many theses and patents. In most of these substances, since the photochromic dyes are deteriorated and decomposed too fast by light, so that the average life span of the photochromic substance is not sufficient, there is a problem in that it is difficult to fabricate a product which is very useful for commercial purposes using the substances. As a result, there is a need for a stable organic photochromic substance.

In order to fabricate such a product, several methods have been proposed. For example, in order to endow a resultant polymer with a photochromic characteristic, there is a method in which the photochromic dye is incorporated into a polymerizable composition. However, there is also a problem that the photochromic dyes are sometimes damaged during a polymerizing process. To relieve the above problem, there are proposed some new solutions as described in U.S. Patent Application Nos. 60/000,829, 60/001,677 and 60/011,429.

In European Patent No. A0195898 and U.S. Pat. No. 4,720,356 corresponding to the European Patent, the photochromic dye is incorporated in a composition of polymerizable matrix of hindered amine as a light stabilizer called HALS (hindered amine light stabilizer). And, in Korean Patent Publication No. 2000-0067988, a matrix for photochromic compounds is disclosed in which a functionalized hindered amine light stabilizer capable of reacting with an isocyanate group is linked to the polymer backbone by a covalent bond to form a grafted structure, thereby having an effect on the photochromic dye, in particular, spirooxazines.

Meanwhile, Korean Patent Publication No. 1995-0009349 describes an encapsulated photochromic composition which is fabricated by using addition agent, oil and gelatin in a spyro-based photochromic substance in order to increase the stability of the photochromic substance. Further, Korean Patent Publication No. 2000-0024335 describes a method of prolonging the photochromic characteristic and heat stability by fabricating a core-shell type nano-capsule, as shown in FIG. 1, having a structure in which a diarylethene-based photochromic compound is surrounded by a high polymer.

Recently, in Korean Patent Publication No. 2004-0073217, there is disclosed an automotive windshield in which a photochromic solution is filled between two glass-substrates, and the color of which can be changed by ultraviolet rays, as shown in FIG. 2.

However, although the method of capsulating the photochromic substance provides an improved tolerance for the deterioration of the photochromic dye, there is also a problem in that it is difficult to commercialize the products due to the question of mass production and the increase in fabricating cost. Further, although the method of filling the photochromic substance between the two glass-substrates provides an extended life span of the product, when the ultraviolet rays are irradiated, the photochromic substance may be decomposed or deteriorated by permeating moisture or air from the outside; or by a very small amount of residual moisture, air, and impurities therein; and then since the decomposed radical substance further decomposes the adjacent photochromic substance, there is another problem in that the life span of the product is sharply reduced.

DISCLOSURE

Technical Problem

To solve the above-mentioned problems, an object of the present invention is to provide a method for preparing a photochromic film or plate, in which a photochromic substance is printed in the unit of an independent spot by various printing methods so that the spots are isolated from each other, thereby prolonging the life of the photochromic substance.

Furthermore, another object of the present invention is to provide a photochromic film or plate fabricated by the above method.

Technical Solution

In order to achieve the above objects, the present invention provides a method of preparing a photochromic film or plate, comprising printing a photochromic substance in the unit of an independent spot on a part or whole of a basic material; and forming a protective layer on the basic material on which the photochromic substance is printed.

In addition, the present invention provides a photochromic film or plate fabricated by the above-mentioned method.

ADVANTAGEOUS EFFECTS

According to the present invention, the method of fabricating the photochromic film or plate can provide a photochromic film or plate in which the life span of the photochromic substance is increased and thus the durability is remarkably improved.

DESCRIPTION OF DRAWINGS

The above and other objects, features and advantages of the present invention will become more apparent from the following description of preferred embodiments given in conjunction with the accompanying drawings, in which.

Figure 1:
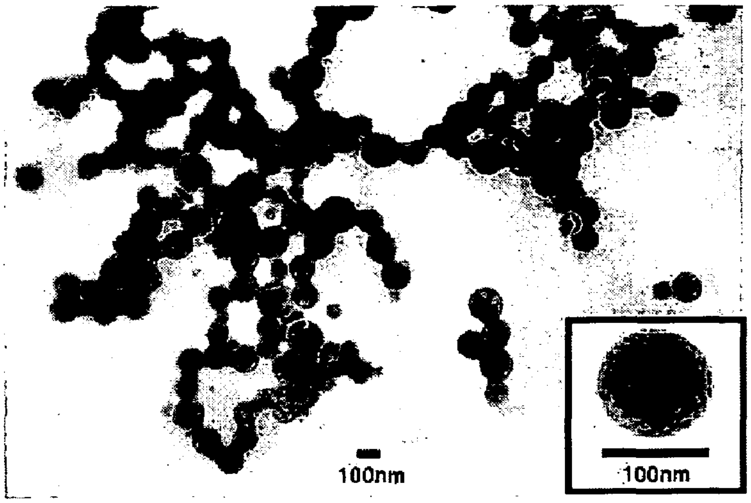
FIG. 1 is a photograph taken by observing a core-shell type nano capsule with TEM.
Figure 2:
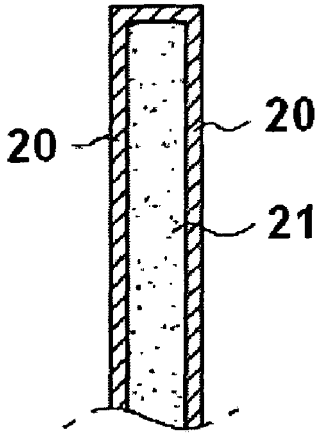
FIG. 2 is a cross-sectional view showing a conventional photochromic glass.

EXPLANATION OF REFERENCE NUMERALS FOR DESIGNATING MAIN COMPONENTS IN THE DRAWINGS

20: glass
21: photochromic solution
31, 41, 51, 61, 71: basic material to be coated
32, 42, 52, 62, 72: photochromic substance
63: adhesive
73, 74: thin film for preventing gas and moisture
33, 63, 75: protective layer or protective film

BEST MODE

Hereinafter, the embodiments of the present invention will be described in detail with reference to the accompanying drawings.

In a method for preparing a photochromic film or plate according to the present invention, a photochromic substance is printed in the unit of an independent spot by various printing methods and then a protective layer is formed on the basic material on which the photochromic substance is printed so that the unit spots are isolated from each other.

Process of Printing Photochromic Substance

In this process, a photochromic substance is printed in the unit of an independent spot on a basic material.

The basic material for printing the photochromic substance can be formed of glass, various plastic materials, an inorganic film, an organic film or a material on which an organic/inorganic hybrid film is coated, ceramic, metal, a fiber, paper and the like.

The photochromic substance may contain a thermosetting or photo-curable monomer, oligomer and an initiator. Further, the photochromic substance is used in the state of being dissolved in a solvent together with a high polymer or being dissolved alone in a proper solvent.

The process of printing the photochromic substance on the basic material further comprises, before and/or after a printing process, a process of coating additionally an inorganic film, an organic film, an inorganic/organic hybrid coating film or a multilayered film thereof in order to lower gas or moisture permeability.

The inorganic film may be formed of metal thin films, metal oxides, metal nitrides, metal fluorides and the like, and the organic film may be formed of polyethylene, polypropylene, polyethylene terephthalate, polyimide, an organic matter containing fluorine, a matter containing carbon and the like.

As known in the art, inkjet printing, roll printing, microcontact printing, thermal transfer printing, screen printing and the like can be used as the method of printing the photochromic substance. But the printing method is not limited to these methods.

Figure 3:
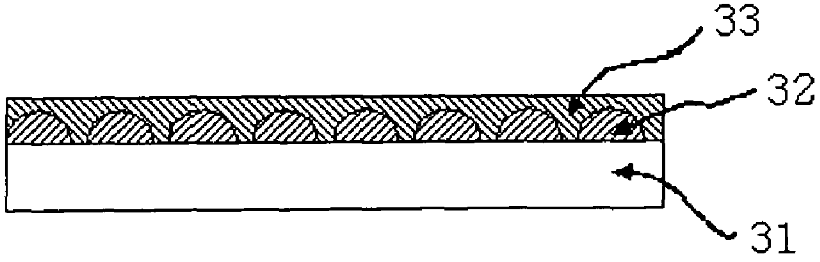
FIG. 3 is a cross-sectional view showing an example of the structure of a photochromic film or plate according to the present invention.

FIG. 3 shows an example of a photochromic film or plate fabricated by a method of preparing a photochromic film or plate according to the present invention.

The size of a spot 32 formed by the photochromic substance printed in the unit of an independent spot on the basic material 31 can be adjusted according to its use, preferably to an extent of 5 nm to 1 mm. In the case that the size of the spot 32 is less than 5 nm, there is a disadvantage in that it is difficult to print the spot. In the case that the size of the spot 32 is more than 1 mm, if a unit spot is defective or the photochromic substance in the unit spot is deteriorated, there is another disadvantage in that its practical utility is lowered, since such a defect is clearly visible.

Figure 4:
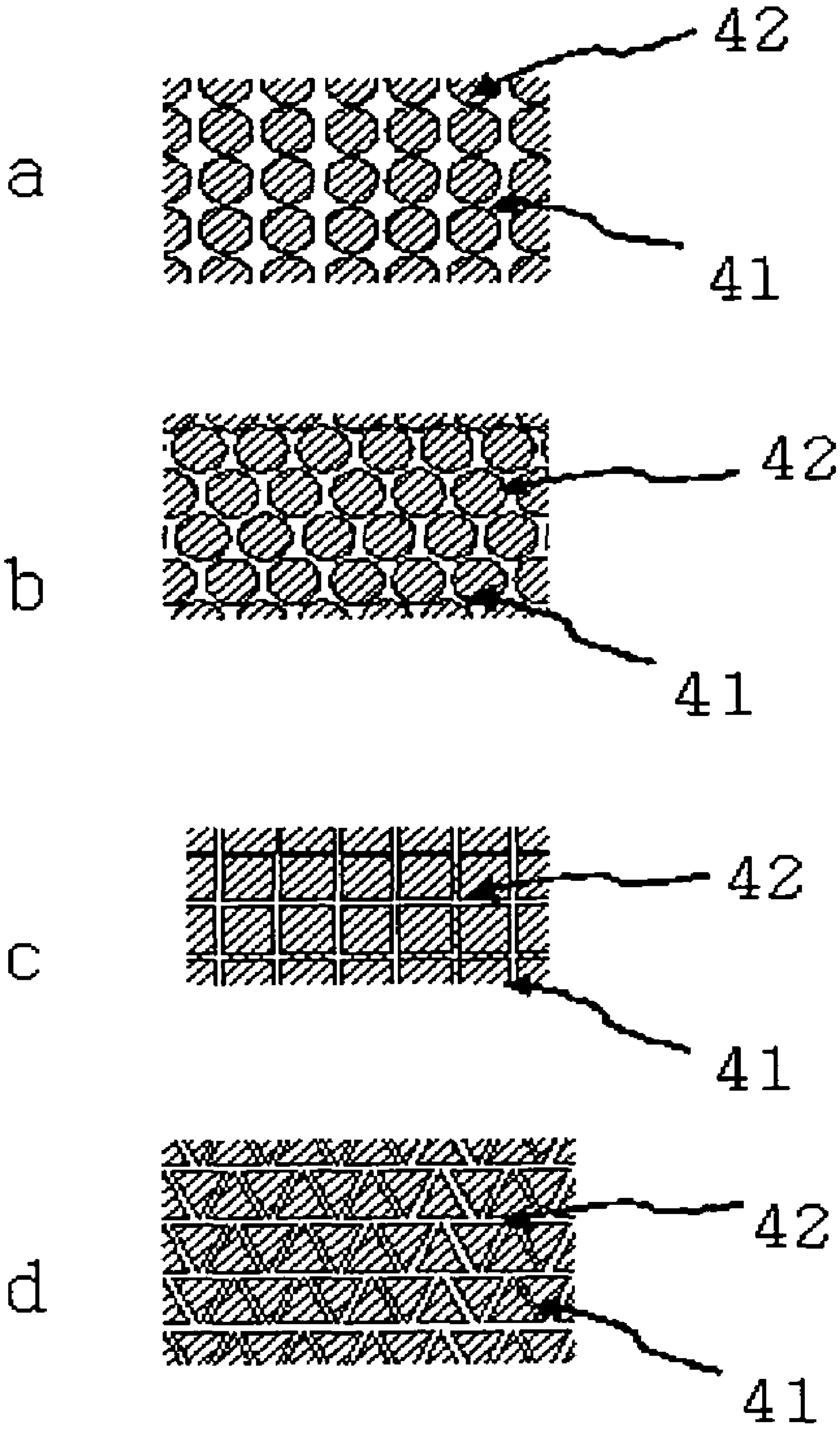
FIG. 4 is a view showing various shapes of the photochromic substance printed in the unit of a spot according to the present invention.

As shown in FIG. 4, the photochromic substance may be printed in the unit of a spot having various shapes such as linearly arrayed circles, obliquely arrayed circles, squares, triangles or a combination thereof, but is not limited to those.

Figure 5:
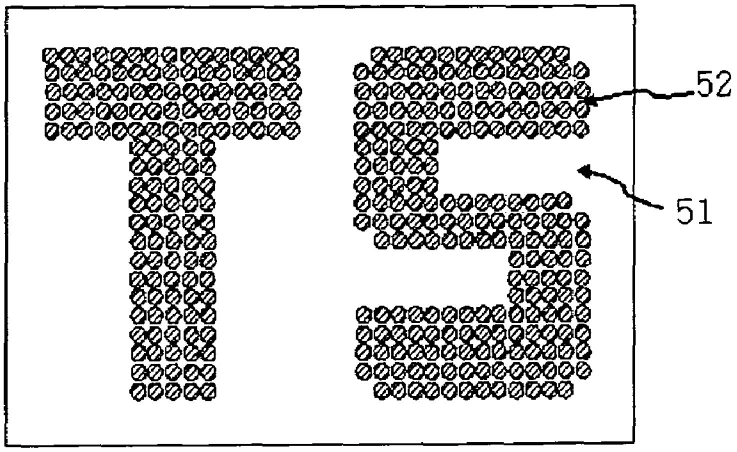
FIG. 5 is a view showing an example of a character or a design printed on a part of the basic material according to the present invention.

The photochromic substance may be printed in the unit of an independent spot on the whole basic material or, as shown in FIG. 5, printed in the form of a character, a design, a picture and the like so as to be used for an advertisement or to be used as a photochromic film or plate of which an aesthetic sense is improved.

Process of Forming Protective Layer

In this process, a protective layer is formed to protect the photochromic substance printed in the unit of a spot on the basic material.

The protective layer may be formed of glass, various plastic materials, an inorganic film, an organic film or a material on which an organic/inorganic hybrid film is coated, ceramic, metal, a fiber, paper and the like.

Figure 6:
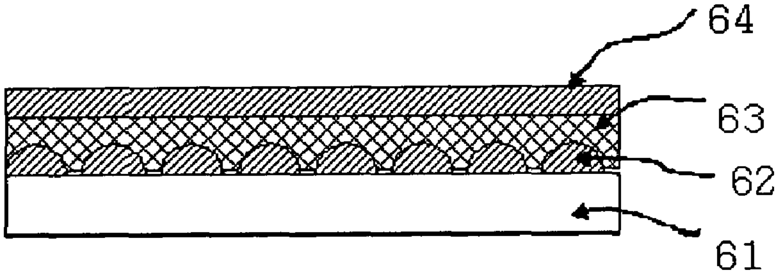
FIG. 6 is a cross-sectional view showing another example of the structure of a photochromic film or plate according to the present invention.
Figure 7:
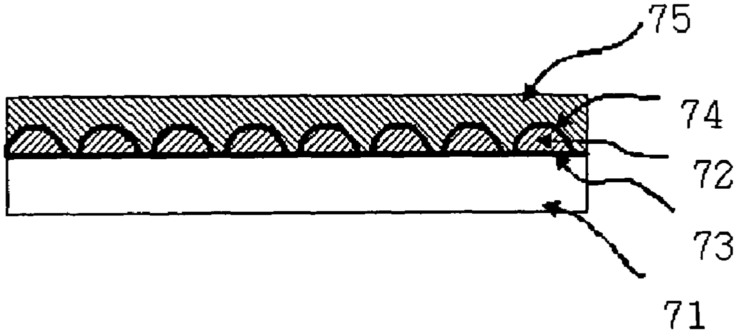
FIG. 7 is a cross-sectional view showing yet another example of the structure of a photochromic film or plate according to the present invention.

The protective layer may be formed on the basic material, on which the photochromic substance is printed, by the method of FIG. 3 in which a coating solution is directly coated and then cured to form the protective layer 33, the method of FIG. 6 in which a protective film 64 is additionally attached by using an adhesive 63, or the method of FIG. 7 in which a material having a lower moisture permeability is additionally deposited or coated as thin films 73 and 74 before and/or after coating the photochromic substance on the basic material and the like.

In addition, the protective layer may be also formed by a functional coating method such as an antifogging coating, a low reflection coating, an antifouling coating and so on.

The coating solution may be a thermosetting or UV cured coating solution including an acrylic hard coating paint or a silicon-based hard coating paint and the like.

The methods of curing the coating solution comprise UV curing, EB (electron beam) curing, thermosetting or natural dry curing.

The protective layer may comprise a further layer coated by the functional coating method.

The photochromic film or plate fabricated by the above-mentioned methods is characterized in that the photochromic substances are printed in the unit of an independent spot of 5 nm to 1 mm and then isolated from each other.

The photochromic film or plate can be used for fabricating spectacle lenses, optical lenses, sunglasses, sun caps, ski goggles, toys, mirrors, glasses, films, building exterior materials, advertising materials, optical discs, etc.

First Embodiment

A photo-curing photochromic coating solution (e.g., AU11PC fabricated by LG chemical LTD) is printed on the basic material of PET film in the form of an independent circular spot having a diameter of 25 μm by using an inkjet printing system (e.g., Jetlab fabricated by Microfab Technologies), and then the printed photochromic coating solution is cured. Using an adhesive, a PET film is attached as a protective layer to a surface of the basic material on which the photochromic coating solution is printed.

Durability of the photochromic film fabricated by the above-mentioned method was measured by using a quick UV tester (Atlas UV2000). On the basis of the light transmittance when the photochromic film is colored just before testing, a time ($t_{1/2}$), when the level of the coloring of the photochromic film is reduced to 50% of an initial value, durability was measured and is indicated in table 1.

Second Embodiment

The method of fabricating the photochromic film in the second embodiment is similar to that in the first embodiment except that, when forming the protective layer, a photo-curable hard coating solution (AU104GN fabricated by LG chemical LTD) is coated and then cured. Then, the durability of the photochromic film was also measured by the method as described in the first embodiment.

Third Embodiment

The method of fabricating the photochromic film in the third embodiment is similar to that in the first embodiment except that the photo-curing photochromic coating solution is printed in the form of an independent square spot of which the length of a side is 50 μm. Then, the durability of the photochromic film was also measured by the method as described in the first embodiment.

Fourth Embodiment

The method of fabricating the photochromic film in the fourth embodiment is similar to that in the first embodiment except that photochromic coating solution is printed on a basic material of PC film. Then, the durability of the photochromic film was also measured by the method as described in the first embodiment.

Fifth Embodiment

The method of fabricating the photochromic plate in the fifth embodiment is similar to that in the first embodiment except that the photochromic coating solution is printed on a glass plate having a thickness of 2 mm as the basic material and a glass plate having a thickness of 2 mm is attached as the protective layer by an adhesive to a surface of the basic material on which the photochromic coating solution is printed. Then, the durability of the photochromic plate was also measured by the method as described in the first embodiment.

Sixth Embodiment

The method of fabricating the photochromic film in the sixth embodiment is similar to that in the first embodiment except that, before printing the photochromic coating solution, $SiO_2$ is coated on the basic material at a thickness of 20 nm by a sputtering method, and after printing the photochromic coating solution, $SiO_2$ is coated again at a thickness of 20 nm by sputtering. Then, the durability of the photochromic film was also measured by the method as described in the first embodiment.

Seventh Embodiment

The method of fabricating the photochromic film in the seventh embodiment is similar to that in the first embodiment except that the photochromic coating solution is printed by roll printing. Then, the durability of the photochromic film was also measured by the method as described in the first embodiment.

Comparative Example 1

The method of fabricating the photochromic film in the example is similar to that in the first embodiment except that the photochromic coating solution is not printed as independent spots but coated as a continuous thin film on the basic material of PET film. Then, the durability of the photochromic film was also measured by the method as described in the first embodiment.

TABLE 1

| | First embodiment | Second embodiment | Third embodiment | Fourth embodiment | Fifth embodiment | Sixth embodiment | Seventh Embodiment | Example 1 |
|---|---|---|---|---|---|---|---|---|
| Durability ($t_{1/2}$, hours) | 720 | 580 | 810 | 670 | 1530 | 940 | 730 | 310 |

As indicated in table 1, in the comparative example 1, since the photochromic layer is coated continuously, if a part of the photochromic layer is inactivated by moisture or oxygen, the inactivated area exerts an influence over adjacent areas and thus the whole area of the photochromic layer is inactivated. Therefore, the durability is remarkably lowered. However, in the first to seventh embodiments, since the photochromic substance is printed in the unit of an independent spot so that the photochromic substances in each of the unit spots are isolated from each other, the inactivated area scarcely exerts an influence over adjacent areas and thus the durability is improved twice or more. In addition, since the glass plate has a lower air or moisture permeability than the film, the glass plate has better durability. In the case that the $SiO_2$ thin film is coated before and after coating of the photochromic substance, the durability is further improved.

INDUSTRIAL APPLICABILITY

As described above, the method of fabricating the photochromic film or plate according to the present invention can provide a photochromic film or plate in which the life span of the photochromic substance is increased and thus the durability is remarkably improved.

Those skilled in the art will appreciate that the concepts and specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the present invention as set forth in the appended claims.

The invention claimed is:

1. A method of preparing a photochromic film or plate, comprising:

printing a photochromic substance in the unit of an independent spot on a part or the whole of a basic material; and forming a protective layer on the basic material wherein the protective layer is formed by a coating solution directly coated and then cured on the basic material on which the photochromic substance is printed, a protective film is additionally attached by using an adhesive, or a material having a lower gas or moisture permeability is additionally deposited or coated in the form of a thin film.

2. The method according to claim 1, further comprising additionally coating an inorganic film, an organic film, an inorganic/organic hybrid coating film or a multilayered film thereof before and/or after the printing of the photochromic substance in the unit of an independent spot on the basic material.

3. The method according to claim 1, wherein the basic material is formed of glass, various plastic materials, an inorganic film, an organic film or a material on which an organic/inorganic hybrid film is coated, ceramic, metal, a fiber, or paper.

4. The method according to claim 1, wherein the printing of the photochromic substance in the unit of an independent spot comprises inkjet printing, roll printing, micro-contact printing, thermal transfer printing and screen printing.

5. The method according to claim 1, wherein the photochromic substance is printed as a spot having a diameter of 5 nm to 1 mm.

6. The method according to claim 1, wherein the protective layer is formed of glass, various plastic materials, an inorganic film, an organic film or a material on which an organic/inorganic hybrid film is coated, ceramic, metal, a fiber, or paper.

7. The method according to claim 1, wherein the coating solution comprises an acrylic hard coating paint and a silicon-based hard coating paint.

8. The method according to claim 1, wherein the method of curing the coating solution comprises UV curing, LB (electron beam) curing, thermosetting or natural dry curing.

9. The method according to claim 1, wherein the protective layer further comprises a functional coating selected from the group consisting of an antifogging coating, a low reflection coating, and an antifouling coating.

10. A photochromic film or plate fabricated by the method according to any one of claims 1 to 6 and 7 to 9, wherein a photochromic substance is printed in the unit of an independent spot so that the printed unit spots are isolated from each other.

11. The photochromic film or plate according to claim 10, wherein the photochromic substance is printed as a spot having a diameter of 5 nm to 1 mm.

12. A use of the photochromic film or plate according to claim 10, for fabricating spectacle lenses, optical lenses, sunglasses, sun caps, ski goggles, toys, mirrors, glasses, films, building exterior materials, advertising materials.

* * * * *